United States Patent
Lopez et al.

(10) Patent No.: US 12,136,526 B2
(45) Date of Patent: Nov. 5, 2024

(54) CIRCUIT BREAKING APPARATUS

(71) Applicant: Hitachi Energy Ltd, Zürich (CH)

(72) Inventors: Sergio Lopez, The Hague (NL);
Esteban Zimmermann, Zürich (CH);
Philipp Erich Burch, Muri (CH)

(73) Assignee: HITACHI ENERGY LTD, Zürich (CH)

( * ) Notice: Subject to any disclaimer, the term of this patent is extended or adjusted under 35 U.S.C. 154(b) by 0 days.

(21) Appl. No.: 17/777,130

(22) PCT Filed: Nov. 9, 2020

(86) PCT No.: PCT/EP2020/081405
§ 371 (c)(1),
(2) Date: May 16, 2022

(87) PCT Pub. No.: WO2021/094226
PCT Pub. Date: May 20, 2021

(65) Prior Publication Data
US 2022/0392721 A1 Dec. 8, 2022

(30) Foreign Application Priority Data
Nov. 15, 2019 (EP) ..................................... 19209514

(51) Int. Cl.
*H01H 11/00* (2006.01)
*G01R 31/327* (2006.01)
(Continued)

(52) U.S. Cl.
CPC ..... *H01H 11/0062* (2013.01); *G01R 31/3274* (2013.01); *H01H 9/56* (2013.01); *H01H 71/70* (2013.01)

(58) Field of Classification Search
None
See application file for complete search history.

(56) References Cited

U.S. PATENT DOCUMENTS

| | | | | |
|---|---|---|---|---|
| 5,629,869 A | * | 5/1997 | Johnson | H01H 11/0062 377/16 |
| 2010/0305719 A1 | * | 12/2010 | Pekar | G05B 13/024 700/44 |

(Continued)

FOREIGN PATENT DOCUMENTS

| | | |
|---|---|---|
| EP | 3460822 A1 | 3/2019 |
| JP | H0230487 A | 1/1990 |
| JP | 2016100009 A | 5/2016 |

OTHER PUBLICATIONS

Reuber Christian; Method for Operating a Medium Voltage Circuit Breaker or Recloser and Medium Voltage Circuit Breaker or Recloser Itself; Date Published Mar. 27, 2019; ABB Schweiz AG; EP 3 460 822 A; CPC H 01 H 11/0062 (Year: 2019).*

(Continued)

*Primary Examiner* — Nasima Monsur
(74) *Attorney, Agent, or Firm* — Sage Patent Group

(57) ABSTRACT

A circuit breaking apparatus comprises a circuit breaker, a motor drive system, and a controller. The circuit breaker is electrically connectable to a power line. The motor drive system is mechanically coupled to the circuit breaker and configured to operate the circuit breaker such as to perform a movement including at least an opening movement from a closed position to an open position, thereby electrically interrupting the power line. The controller includes a model of at least one of the motor drive system and the circuit breaker.
The controller is configured to receive reference travel curve information of the movement; generate actuator information from the reference travel curve information based on the model; and output the actuator information.

15 Claims, 3 Drawing Sheets

(51) Int. Cl.
    *H01H 9/56*   (2006.01)
    *H01H 71/70*  (2006.01)

(56) References Cited

U.S. PATENT DOCUMENTS

| | | | | |
|---|---|---|---|---|
| 2012/0053886 | A1* | 3/2012 | Poeltl | H01H 1/0015 |
| | | | | 702/149 |
| 2017/0047181 | A1* | 2/2017 | Yang | H01H 3/3005 |
| 2018/0082816 | A1* | 3/2018 | Herrmann | H01H 33/59 |

OTHER PUBLICATIONS

International Search Report and Written Opinion of the International Searching Authority, PCT/EP2020/081405, mailed Jan. 19, 2021, 16 pages.
Extended European Search Report, EP19209514.9, mailed Apr. 23, 2020, 16 pages.
Chen, Y., "Design and Implementation of Model Predictive Control Algorithms for Small Satellite Three-Axis Stabilization," Thesis, University of Sidney, School of Aerospace, Mechanical and Mechatronic Engineering, Submitted Mar. 2011, 127 pages.
Klauco, M., et al., "Implicit vs Explicit MPC: Similarities, Differences, and a Path towards a Unified Method," IEEE 2016 European Control Conference (ECC) Jun. 29-Jul. 1, 2016, 60 pages.
Quirynen, R., "Numerical Simulation Methods for Embedded Optimization," Ku Leuven, Arenberg Doctoral School, Faculty of Engineering Science, Jan. 2017, 326 pages.
Rajasingham, T. A., "A Two-Stage Multiobjective Predictive Control Approach for Low Temperature Combustion Engines," © VDI Verlag GmbH—Düsseldorf 2014 (presented Oct. 2, 2013) 172 pages.
Zeilinger, M. N., "Real-Time Model Predictive Control," Dipl.-Ing., University of Stuttgart, Dissertation submitted to ETH Zurich, Diss. Eth. No. 19524, 2011, 178 pages.
Bemporad, A., et al., "The explicit linear quadratic regulator for constrained systems," revised Oct. 9, 2000; received in final form Jun. 16, 2001 © 2001, Elsevier Science Ltd., 18 pages.
Barrera-Cardenas, R., et al., "Optimal LQG Controller for Variable Speed Wind Turbine Based on Genetic Algorithms," Technoport RERC Research 2012, Energy Procedia 20 (2012) 10 pages.
Ding, Y., "Fast Model Predictive Control Combining Offline Method and Online Optimization with K-D Tree," Research Article, Hindawi Publishing Corporation, Mathematical Problems in Engineering, vol. 2015, Article ID 982041, Revised Jul. 5, 2015; Accepted Jul. 22, 2015, 11 pages.
Notice of Reasons for Refusal, Japanese Patent Application No. 2022-528073, mailed Jul. 7, 2023, 5 pages.

* cited by examiner

CIRCUIT BREAKING APPARATUS

CROSS REFERENCE TO RELATED APPLICATIONS

This application is a 35 U.S.C. § 371 national stage application of PCT International Application No. PCT/EP2020/081405 filed on Nov. 9, 2020, which in turn claims foreign priority to European Patent Application No. 19209514.9, filed on Nov. 15, 2019, the disclosures and content of which are incorporated by reference herein in their entirety.

TECHNICAL FIELD

The present disclosure relates to a circuit breaking apparatus. It relates particularly to a circuit breaking apparatus including a motor drive to control a circuit breaker for a generator of a power plant, such as a circuit breaker rated for a nominal current typically flowing in the field of power plant generators, such as a nominal current of 63 kA or more.

BACKGROUND

A circuit breaker configured for use with a generator in a power plant is designed to switch, i.e. interrupt or connect, large currents in the range of several tens to several hundreds of kiloamperes flowing in a power line. Some circuit breaking apparatuses include a circuit breaker of such kind, and a motor drive system configured to operate the circuit breaker.

A part of the motor drive system is mechanically linked, or coupled, to the circuit breaker and configured to operate the circuit breaker. Typically, operating includes performing at least one of an opening movement and a closing movement of the circuit breaker. In an opening movement, for example, relevant parts of the circuit breaker are moved from a closed position to an open position, thereby electrically interrupting the power line.

In such an opening movement, it is desirable to control the movement characteristics of the circuit breaker via control of the motor drive system.

In certain configurations, it may also be convenient to control a travel curve in a closing movement of the circuit breaker.

SUMMARY OF THE INVENTION

According to an aspect, a circuit breaking apparatus having the features disclosed herein is provided.

In embodiments, a circuit breaking apparatus comprises a circuit breaker, a motor drive system, and a controller.

The circuit breaker is electrically connectable to a power line. For example, the circuit breaker has an input terminal and an output terminal, and the circuit breaker is connectable in between the power line. The power line is a line for the transport of electrical power. For example, the power line may be an output line on the primary or secondary side of a transformer, or it may be an output line of an electrical generator, such as a power plant generator.

The motor drive system is mechanically coupled to the circuit breaker. As used herein, mechanically coupled may include an actuating member that is interposed between a motor of the motor drive system and a handling element of the circuit breaker. For example, the actuating member is a linkage mechanism whose input side is mechanically connected to an output side of the motor and whose output side is mechanically connected to a circuit breaker chamber of the circuit breaker.

The motor drive system is configured to operate the circuit breaker. Operating the circuit breaker may include, for example, that a movement is performed on an element of the circuit breaker, such as the handling element. The movement is typically performed via the actuating member connected to the motor drive, such as the linkage. The movement includes at least an opening movement of the circuit breaker to make the circuit breaker, when it is in a closed position, to assume an open position. By the opening movement, the power line is electrically interrupted. For example, in the open position, a first end of the power line connected to the input terminal, and a second end of the power line connected to the output terminal, are electrically separated from each other.

The controller includes a model of at least one of the circuit breaker and the motor drive system. Typically, the controller includes a model of both the motor drive system and the circuit breaker. For example, the model describes a coupling between the motor and the linkage, such as a motor torque acting on the linkage, and a coupling between the linkage and the circuit breaker, such as a reaction force received by the linkage when operating the handling element of the circuit breaker.

The controller is configured to receive reference travel curve information of the movement. The controller is further configured to generate actuator information from the reference travel curve information based on the model; and to output the actuator information to the motor drive system to control a travel curve via model-based control.

Typically, the reference travel curve information includes at least information of the opening movement. In this example, the controller is configured to receive reference travel curve information of the opening movement; to generate actuator information from the reference travel curve information based on the model for the opening movement; and to output the actuator information to the motor drive system to control a circuit breaker opening travel curve via model-based control. In some embodiments, the reference travel curve information includes reference on trajectory and speed.

In some embodiments, the movement further includes a closing movement of the circuit breaker to make the circuit breaker, when it is in an open position, to assume a closed position. By the closing movement, the power line is electrically connected. For example, in the closed position, the first end of the power line connected to the input terminal, and the second end of the power line connected to the output terminal, are electrically connected to each other. In such embodiments, for example, the controller is further configured to receive reference travel curve information of the closing movement; to generate actuator information from the reference travel curve information based on the model for the closing movement; and to output the actuator information to the motor drive system to control a circuit breaker closing travel curve via model-based control.

As used herein, model-based control may comprise performing model predictive control, such as, but not limited to, dynamic matrix control, model algorithmic control, linear quadratic Gaussian control, and/or generalized predictive control.

Throughout the present application, the circuit breaking apparatus is not limited to a single-phase configuration. For example, the circuit breaker of the circuit breaking apparatus may be electrically connectable to a multi-phase power line, such as a three-phase power line.

As used herein, the reference travel curve may comprise information on a circuit breaker position and/or a movement speed in the course of time. In some embodiments, the reference travel curve comprises a time-dependent progression of a reference position of a part of the motor drive system or the circuit breaker. Typically, the reference travel curve comprises a time-dependent progression of a reference position of the circuit breaker position, e.g. a desired position, at any point in time between the open and the closed state and/or between the closed state and the open state, of the handling element of the circuit breaker or the circuit breaker contacts. It is noted that this reference position may include intermediary positions, i.e. position in which the circuit breaker is not (yet) entirely open or closed, respectively. Additionally or alternatively, the reference travel curve comprises a time-dependent progression of a reference speed of the circuit breaker position, e.g. a desired speed, at any point in time between the open and the closed state and/or between the closed state and the open state, of the handling element of the circuit breaker or the circuit breaker contacts.

In some embodiments, the motor drive system comprises a motor coupled to a linkage. The linkage is configured to transform a rotary motion of the motor into a substantially linear motion and output the linear motion to the circuit breaker. In this connection, the model comprises information on a motor torque between the motor and the linkage, and information on a reaction force between the linkage and the circuit breaker.

Optionally, the model may additionally comprise information on pressure and/or friction dynamics. The pressure dynamics mimic the friction occurring in the system, e.g. the friction between the motor and the linkage, the friction between the linkage and the circuit breaker, or both. The pressure dynamics mimic the gas pressure in the system, e.g. the gas pressure in a circuit breaker chamber. The pressure dynamics result in forces that ultimately act on the linkage that is connected to the chamber.

In some embodiments, the model-based control comprises using an optimized control strategy that is mathematically optimized for at least one optimization objective in an optimization problem. The optimization objective may be one or more selected from a group consisting of a position described by the reference travel curve information, and a speed described by the reference travel curve information. The position may be a reference position of the circuit breaker position, e.g. a desired position, at any point in time between the open and the closed state and/or between the closed state and the open state, of the handling element of the circuit breaker or the circuit breaker contacts. The speed may be a reference speed of the circuit breaker position, e.g. a desired speed, at any point in time between the open and the closed state and/or between the closed state and the open state, of the handling element of the circuit breaker or the circuit breaker contacts.

In some embodiments, the controller has access to a set of pre-calculated control parameters that describe the optimized control strategy. The controller is further configured to perform the model-based control using the pre-calculated control parameters. The controller may be configured to perform the model-based control via a fast feed forward control and a robust feedback control using the pre-calculated control parameters.

Alternatively or additionally, in embodiments, the controller is further configured to compute control parameters that describe the optimized control strategy, and to perform the model-based control using the computed control parameters. The controller may be further configured to update the control parameters using the computed control parameters. Typically, the controller is further configured to perform the model-based control as a model predictive control.

In some embodiments, the optimization problem comprises a cost function and at least one constraint equation. The cost function includes the optimization objective. The at least one constraint equation describes a threshold for a varying magnitude of the circuit breaking apparatus. The varying magnitude varies in the course of the movement. In this connection, the threshold for the varying magnitude may include one or more of the following: A separation speed of the circuit breaker contacts when the movement is an opening movement; an approaching speed of the circuit breaker contacts when the movement is a closing movement; a temperature within the circuit breaker chamber; a motor torque; a linkage force.

In some embodiments, the controller is further configured to receive operational data that relate to model parameters of the model, and to update the model parameters of the model using the received operational data. Operational data may include a behavior of the circuit breaking apparatus such as a degraded behavior due to aging of the apparatus components. As the circuit breaking apparatus and/or parts thereof age during the lifecycle, the operational data may be used to update, or adapt, the model to a present state of the apparatus.

In some embodiments, the circuit breaker is a generator circuit breaker for a generator of a power plant. Typically, the generator circuit breaker is rated for a nominal current of 63 kiloamperes or more.

BRIEF DESCRIPTION OF THE DRAWINGS

Embodiments of the present disclosure will be described with reference to the drawings in which.

DETAILED DESCRIPTION

The following is a general overview on the present technology and a description of embodiments of the present disclosure that will be described with reference to the drawings.

Figure 1:
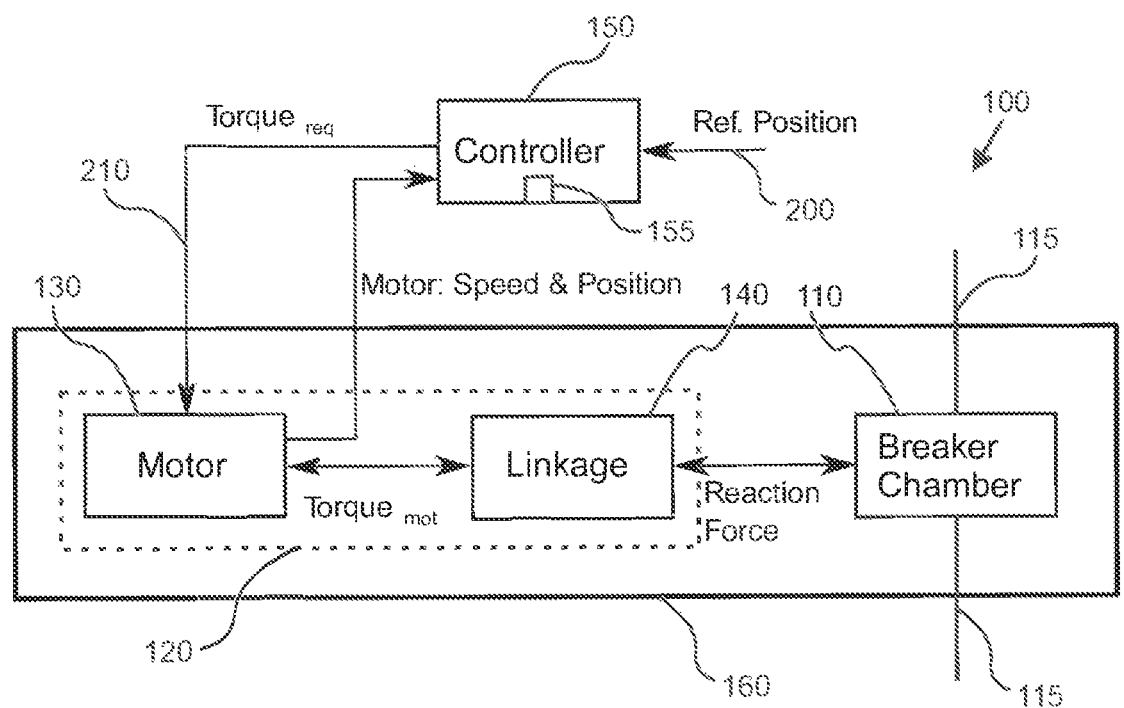
FIG. 1 is a block diagram showing an overview of a configuration of a circuit breaking apparatus according to an embodiment.

FIG. 1 is a block diagram for illustrating a configuration of a circuit breaking apparatus 100. In FIG. 1, a motor drive system 120 is mechanically coupled to a circuit breaker 110. The circuit breaker 110 has terminals (not shown) connected in between a power line 115 (a high voltage line), and configured to selectively interrupt and/or close an electrical connection in the power line 115. To perform such an action, the motor drive system 120 operates the circuit breaker 110 between an open position and a closed position and/or between the closed position and the open position.

The motor drive system 120 includes a motor 130 and a linkage 140. The motor 130 is configured to apply a motor torque $Torque_{mot}$ to the linkage 140. The linkage 140 is configured to translate a rotary motion received from the motor 130 on an input side thereof into a substantially linear motion, and to output the substantially linear motion on an output side thereof. The linkage 140 is coupled to the circuit breaker 110 and transfers the forces or torques from the motor to the circuit breaker 110. The circuit breaker 110 typically includes a circuit breaker chamber in which electrical circuit breaker contacts are arranged that perform the actual interrupting and/or closing option of the electrical connection. Typically, a handling element (not shown) is provided on the circuit breaker 110 for establishing the mechanical interconnection between the circuit breaker contacts and the linkage 140. An entity of motor 130, linkage 140, and breaker chamber 110 may be called a mechanical entity 160 in the following.

A controller 150 is provided for controlling the movement, or motion, of the motor 130. In the example shown in FIG. 1, the controller outputs a required torque $Torque_{req}$ to the motor 130. In FIG. 1, the controller 150 is a closed-loop controller. A signal representing a motor speed of the motor 130 and a motor position of the motor 130 is fed back to the controller 150.

It is desired that the motor drive system 120 controls a movement of the circuit breaker 110, or indirectly a movement of the contacts of the circuit breaker, to follow a reference travel curve. In conventional systems without a motor drive, there was no possibility to control the movement of the circuit breaker during an opening movement or a closing movement of the circuit breaker contacts.

When the motor drive system 120 was introduced, it became possible to control further degrees of freedom, e.g. for increasing the robustness, lifetime, state of health, etc., of a circuit breaking apparatus. Conventionally, a travel curve configuration of the motor drive system 120 involves a control-systems based approach. Namely, in conventional configurations, the travel curve configuration of the motor drive system 120 is split into a plurality of consecutive stages. A tracked reference curve is configured individually for each of the consecutive stages. Furthermore, transitioning criteria for transitioning from one stage to the next stage in the plurality of consecutive stages are defined from a control systems perspective. The controller itself comprises 3 individual and cascaded PI controllers. A first one of the PI controllers controls the circuit breaker contact position. A second one of the PI controllers controls the speed of the movement of the circuit breaker contacts. A third one of the PI controllers controls the torque applied by the motor to the linkage system. The transitioning is typically defined by target thresholds, e.g. speed thresholds, position thresholds, or time thresholds.

In the conventional approach, the PI controllers, and the target thresholds for the transitioning, have to be defined for a circuit breaking apparatus, which is not intuitive for a circuit breaker engineer; thus, a system designer having thorough knowledge of control systems is required. Furthermore, the travel curve configuration is limited to a predefined number of stages, typically 6 stages, with fixed control parameters assigned to each of the stages. A direct travel curve optimization is not possible in the conventional technology.

Figure 2:
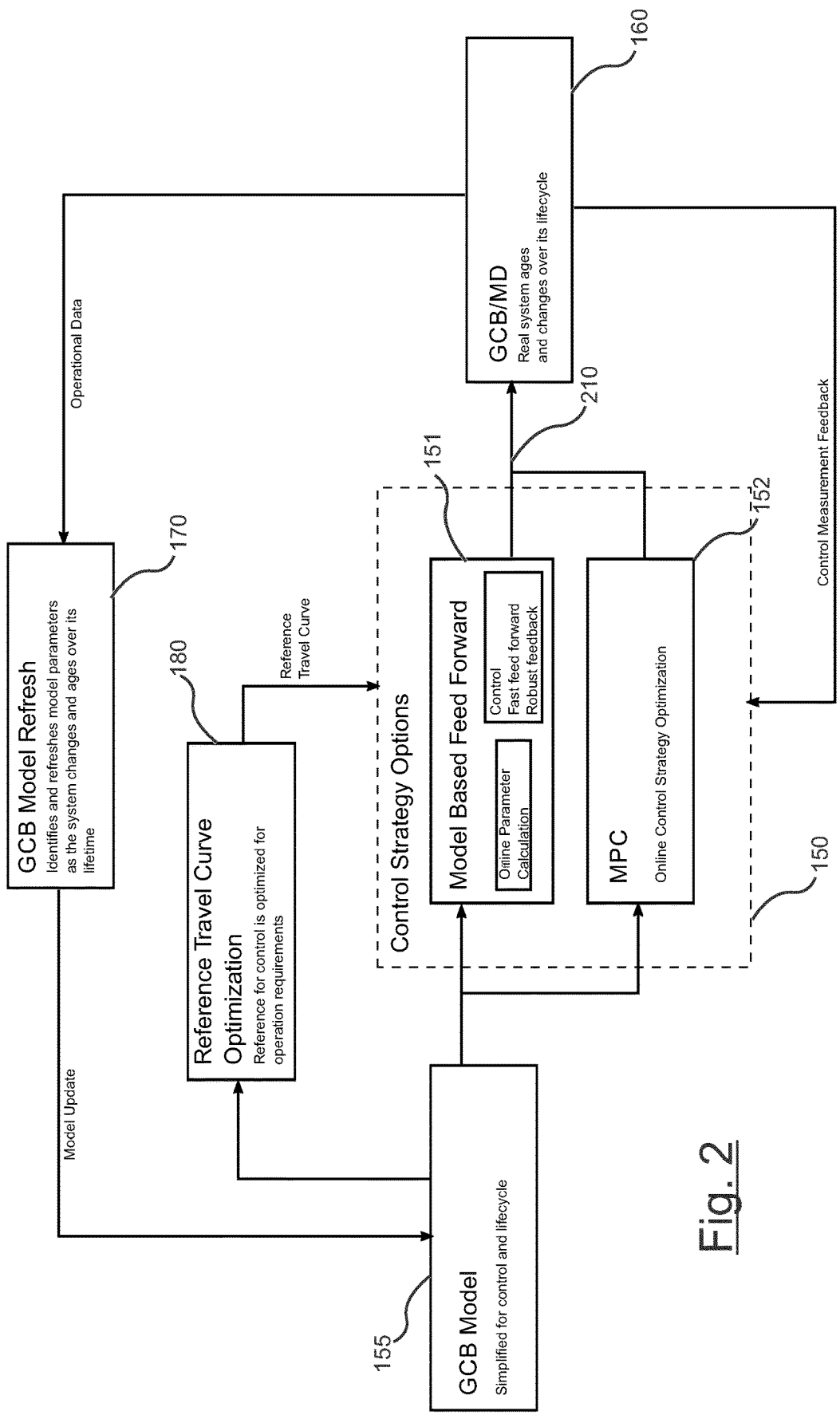
FIG. 2 is a block-base flowchart of details of a control performed by a controller of the circuit breaking apparatus of FIG. 1.
Figure 3:
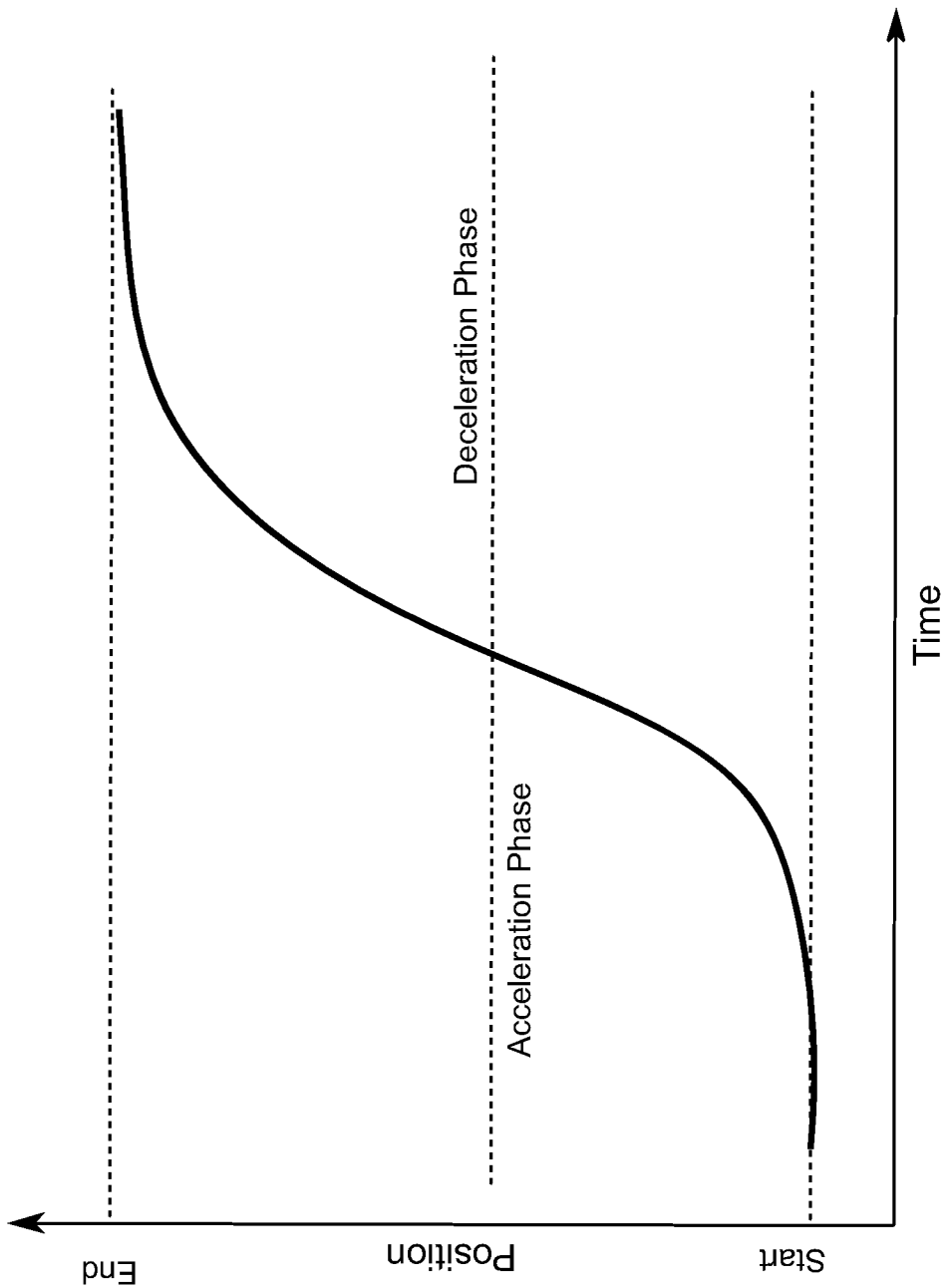
FIG. 3 is an example of a travel curve used in a model-based control performed by the controller.

FIG. 2 is a block-base flowchart of details of a control performed by a controller of the circuit breaking apparatus of FIG. 1. FIG. 3 is an example of a travel curve used in a model-based control performed by the controller. The following makes common reference to FIGS. 1-3.

In the technology according to the present disclosure, the controller 150 includes a model 155. The model 155, or a mathematical description thereof, depicts relevant physical phenomena having an influence on the control of the movement in connection with the circuit breaker. The controller 150 receives reference travel curve information 200 of the movement. An example of a travel curve of which appropriate reference travel curve information 200 are derivable is depicted in FIG. 3, to be described later. The controller 150 generates actuator information 210 from the reference travel curve information 200. For generating the actuator information 210, the controller uses the model 155; i.e., the actuator information 210 are based on the model 155. The controller 150 outputs the actuator information 210 to the motor drive system 120 in order to control a travel curve of the movement of the circuit breaker 110, or parts thereof. The controlling is done via model-based control.

Model-based control is a control approach that is generally known to the skilled person. For example, the paper by Barrera-Cardenas R, Molinas M, "Optimal LQG Controller for Variable Speed Wind Turbine Based on Genetic Algorithms", Energy Procedia 20 (2012), 207-216, shows a model-based control approach in the context of wind turbines. As another example, the paper by Ding Y, Xu Z, Zhao J, Shao Z, "Fast Model Predictive Control Combining Offline Method and Online Optimization with K-D Tree", accessible via Document Online Identifier at http://dx.doi.org/10.1155/2015/982041, describes a use case of Model Predictive Control, that is a model-based control approach, under the specific aspect of computational power.

The model-based control approach addresses the fact that, for example, the torque applied from the motor 130 to the linkage 140 does not always translate to the same torque or force on the output side of the linkage, e.g., in an opening movement, due to variations of the current flowing through the circuit breaker contacts, and a resulting variation of the force needed to separate the contacts. Moreover, friction and pressure are not always the same across multiple operations, i.e. the pressure buildup differs, and the system inertia is not linear. The model-based control is able to still maintain, to an appropriate degree, a reference travel curve, as it has "knowledge" on the system dynamics.

Model-based control, such as Model Predictive Control (MPC), may comprise a control employing an approach known as Dynamic Matrix Control (DMC), Model Algorithmic Control (MAC), Generalized Predictive Control (GPC), but is not limited thereto.

In the model-based control for the present circuit breaking apparatus, a model of the system e.g. consisting of the motor drive and the circuit breaker is created. One or more optimization objectives, such as the travel curve, are described as mathematical conditions. The solution of the one or more optimization objectives is the control strategy for the motor drive system 120, controlled by the controller 150 having the model 155.

According to an aspect, the model is a system model that is linearized, and a state space model is incorporated into equality constraints having a form of $(x(k+1)=A \cdot x(k)+B \cdot u(k))$, with x being the state vector, u being the input vector, A being the state matrix, B being the input matrix, and k being the index variable. With a linearized system model as the model, a linear model-based control is performed; the linear model-based control may comprise a linear Model Predictive Control, MPC. The linear system model may be a constant linear model or a time-varying linear system model. A time-varying linear system model is typically adapted, during the operation of the apparatus, to system properties that may change over time, such as mechanical wear of the system components.

According to another aspect, the model is a nonlinear system model. For example, the circuit breaker system dynamics and expected additional inertias, and possibly, additionally those of the motor drive or parts thereof, such as friction and pressure development are taken into account for equality constraints having a form of (x(k+1)=f(x(k), u(k))), with x being the state vector, u being the input vector, and f being a function containing the nonlinear representation of the circuit breaker, possibly including the motor drive or parts thereof, as a nonlinear circuit breaker model. The function f uses an integration method to predict the future system states over a prediction horizon. The prediction horizon may be a receding prediction horizon, or receding finite prediction horizon. By way of example, the integration method comprises one of $1^{st}$ order Euler method, or Runge-Kutta method.

According to another aspect, the model 155 is none of a classical control systems model such as a state space model, a transfer function model, or the like. Rather, the model 155 may be a model having less demands on mathematical accuracy than a state space model or a transfer function model; in this case, the model 155 may be updateable, or adaptive, e.g. by model parameter feedback.

The model-based control is typically based on a set of algorithms that, in turn, are based on the model 155. In model-based control such as MPC, the control moves issued by the controller 150 to the motor drive system 120 are implemented in a receding, finite-horizon manner A cost function is optimized such that future control moves are determined, wherein the cost function involves the future behavior of the system. For example, the cost function may be such that a variance is minimized when by the future output of the controller 150 to the motor drive system 120, the reference travel curve is position-tracked and/or speed-tracked.

The cost function may punish one or more of: A position error and a speed error of the desired movement, to provide a follow reference; a motor actuation, to have the motor get to stillstand/stoppage; and a motor torque deviation, to avoid motor damage and/or to minimize wear of the motor. The cost function may be a convex cost function taking into account constraints such as a limited motor torque and/or a limited motor speed, etc.

The optimization problem, or optimization objective, may be one or more of a position described by the reference travel curve information 200 and a speed described by the reference travel curve information 200. The optimization problem may be solved online or offline. When solved online, the controller 150 is configured to compute control parameters describing the optimized control strategy, and to perform the model-based control using the computed control parameters. When solved offline, the controller has access to a set of pre-calculated control parameters that describe the optimized control strategy, and the controller is configured to perform the model-based control using the pre-calculated control parameters. Also, a hybrid approach is conceivable, where the controller computes a limited set of control parameters for certain selected quantities while using pre-calculated control parameters for other quantities.

In the block diagram of FIG. 2, the model 155, exemplified as a generator circuit breaker (GCB) model, receives model update parameters from a GCB model refresh block 170. The GCB model may be simplified such that the controller 150 can computationally cope with the controlling action. The model 155 may be input into a reference travel curve optimization block, or directly into the controller 150.

As shown in FIG. 2, the controller 150 may be configured to choose an appropriate control strategy. Alternatively, the controller 150 may be fixed to one control strategy. The control strategies comprise at least one of using the pre-calculated control parameters, e.g. via a fast feed forward control and a robust feedback control, and computation of the control parameters and performing the model-based control using the computed control parameters, that is, an online control strategy optimization. In FIG. 2, using pre-calculated control parameters is exemplified by a model-based feed forward strategy 151. Furthermore, in FIG. 2, computing the control parameters and performing a model-based control using the computed control parameters is exemplified by a Model Predictive Control, MPC, 152. In the course of performing the selected control strategy, the controller 150 generates the actuator information 210.

As further illustrated in FIG. 2, the controller 150 outputs the generated actuator information 210 to the motor drive system 120 and, indirectly via the linkage 140, to the circuit breaker that form the mechanical entity 160. In FIG. 2, the mechanical entity 160 is labelled as "GCB/MD", i.e. generator circuit breaker and motor drive system. Measurement values are fed back to the controller 150 as control measurement feedback. Moreover, operational data are output to the model refresh block 170. The model refresh block 170 may output model update data for model 155 adaptation. The model update data may reflect changes of the system, such as an aging of the circuit breaking apparatus during the lifecycle, or lifetime, thereof.

As further shown in FIG. 2, model data output from the model 155 may be input into a reference travel curve optimization block 180. In the reference travel curve optimization block 180, the reference travel curve information 200 are subjected an optimization for operation requirements, such as motor constraints like torque, speed etc.

The desired travel curve shown in FIG. 3 may serve as an exemplary basis for deriving reference travel curve information 200. For example, the desired travel curve may be sampled and input into the controller or a computer for deriving the actual reference travel curve information 200 that is usable by the controller 150.

As shown in FIG. 3, the travel curve describes a movement between a start position and an end position. The start position may be a closed position of the circuit breaker contacts, and the end position may be an open position thereof. However, it may also be considered that the start position may be an open position of the circuit breaker contacts, and the end position may be a closed position thereof.

In FIG. 3, the travel curve describes an acceleration of the circuit breaker contacts, the movement of which being controlled via the controller and the motor drive system 120, and a deceleration phase thereof. Thus, acceleration and deceleration may be smoothed out, effectively enhancing the life cycle of the circuit breaker 110.

While the foregoing described the invention in example embodiments, any aspects, features, elements etc. and their respective combinations are illustrative. One skilled in the art will devise numerous variations of the technology described above without departing from the gist of the invention whose scope is defined in the claims that follow.

The invention claimed is:

1. A circuit breaking apparatus, comprising:
   a circuit breaker electrically connected to a power line;
   a motor drive system comprising a motor coupled to a linkage, the motor drive system being mechanically coupled to the circuit breaker and configured to operate the circuit breaker such as to perform a movement including at least an opening movement from a closed position to an open position, thereby electrically interrupting the power line;

a controller configured to control the motor drive system based on a model of at least one of the motor drive system and the circuit breaker, wherein the controller is configured to:

receive reference travel curve information of the movement of the circuit breaker, wherein the reference travel curve information comprises a reference on trajectory and speed;

generate actuator information from the reference travel curve information based on the model wherein the actuator information comprises information that is output to the motor drive system to control a circuit breaker opening travel curve; and output the actuator information to the motor drive system to control a travel curve via model-based control, wherein model-based control comprises performing model predictive control, wherein the model-based control comprises using an optimized control strategy mathematically optimized for at least one optimization objective in an optimization problem, the optimization objective being selected from a group consisting of: a position described by the reference travel curve information and a speed described by the reference travel curve information, the reference travel curve comprises information on a circuit breaker position and/or a movement speed in the course of time, wherein the optimization problem comprises a cost function including the optimization objective, and at least one constraint equation, the at least one constraint equation describing a threshold for a varying magnitude of the circuit breaking apparatus that varies during the movement, and wherein the reference travel curve comprises a time dependent progression of a reference position of a part of the motor drive system or the circuit breaker.

2. The circuit breaking apparatus of claim 1, wherein the movement further includes a closing movement from an open position to a closed position.

3. The circuit breaking apparatus of claim 1, wherein the linkage is configured to transform a rotary motion of the motor into a substantially linear motion and output the linear motion to the circuit breaker; and wherein the model comprises information on a motor torque between the motor and the linkage, and information on a reaction force between the linkage and the circuit breaker.

4. The circuit breaking apparatus of claim 1, wherein the controller has access to a set of pre-calculated control parameters describing the optimized control strategy; and wherein the controller is further configured to perform the model-based control via a fast feed forward control and a robust feedback control using the pre-calculated control parameters.

5. The circuit breaking apparatus of claim 1, wherein the controller is further configured to compute and update control parameters describing the optimized control strategy, and to perform the model-based control via a fast feed forward control and a robust feedback control using the computed control parameters.

6. The circuit breaking apparatus of claim 1, wherein the threshold for the varying magnitude includes one or more of a separation speed of circuit breaker contacts when the movement is an opening movement, an approaching speed of circuit breaker contacts when the movement is a closing movement, a temperature within a circuit breaker chamber, a motor torque, a linkage force.

7. The circuit breaking apparatus of claim 1, wherein the controller is further configured to receive operational data relating to model parameters of the model, and to update the model parameters of the model using the received operational data.

8. The circuit breaking apparatus of claim 1, wherein the circuit breaker is a generator circuit breaker for a generator of a power plant, in particular a generator circuit breaker rated for a nominal current of 63 kA or more.

9. The circuit breaking apparatus of claim 1, wherein the movement further includes a closing movement from an open position to a closed position.

10. The circuit breaking apparatus of claim 1, wherein the linkage being configured to transform a rotary motion of the motor into a substantially linear motion and output the linear motion to the circuit breaker.

11. The circuit breaking apparatus of claim 10, wherein the model comprises information on a motor torque between the motor and the linkage, and information on a reaction force between the linkage and the circuit breaker.

12. The circuit breaking apparatus of claim 1, wherein the controller has access to a set of pre-calculated control parameters describing the optimized control strategy.

13. The circuit breaking apparatus of claim 12, wherein the controller is further configured to perform the model-based control via a fast feed forward control and a robust feedback control using the pre-calculated control parameters.

14. The circuit breaking apparatus of claim 1, wherein the controller is further configured to compute and update control parameters describing the optimized control strategy.

15. The circuit breaking apparatus of claim 1, wherein the controller is further configured to receive operational data relating to model parameters of the model, and wherein the circuit breaker is a generator circuit breaker for a generator of a power plant, in particular a generator circuit breaker rated for a nominal current of 63 kA or more.

* * * * *